(12) United States Patent
Nakazawa et al.

(10) Patent No.: US 8,187,941 B2
(45) Date of Patent: May 29, 2012

(54) METHOD OF MANUFACTURING SEMICONDUCTOR DEVICE

(75) Inventors: Yoshito Nakazawa, Tokyo (JP); Hitoshi Matsuura, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/244,455

(22) Filed: Sep. 24, 2011

(65) Prior Publication Data

US 2012/0021578 A1 Jan. 26, 2012

Related U.S. Application Data

(63) Continuation of application No. 12/434,655, filed on May 3, 2009, now Pat. No. 8,030,704, which is a continuation of application No. 11/958,363, filed on Dec. 17, 2007, now Pat. No. 7,595,242.

(30) Foreign Application Priority Data

Dec. 28, 2006 (JP) .................................. 2006-354339

(51) Int. Cl.
*H01L 21/336* (2006.01)
(52) U.S. Cl. ................... 438/270; 257/E21.41

(58) Field of Classification Search .......... 438/269–272; 257/332, E29.262
See application file for complete search history.

(56) References Cited

U.S. PATENT DOCUMENTS

| 5,216,275 | A | 6/1993 | Chen |
| 6,916,745 | B2 | 7/2005 | Herrick et al. |
| 7,224,022 | B2 * | 5/2007 | Tokano et al. ................ 257/328 |
| 2006/0216896 | A1 | 9/2006 | Saito et al. |
| 2007/0120201 | A1 | 5/2007 | Yamaguchi et al. |

* cited by examiner

*Primary Examiner* — William D Coleman
*Assistant Examiner* — Daniel Shook
(74) *Attorney, Agent, or Firm* — Miles & Stockbridge P.C.

(57) ABSTRACT

A trench gate type power transistor of high performance is provided. A trench gate as a gate electrode is formed in a super junction structure comprising a drain layer and an epitaxial layer. In this case, the gate electrode is formed in such a manner that an upper surface of the epitaxial layer becomes higher than that of a channel layer formed over the drain layer. Then, an insulating film is formed over each of the channel layer and the epitaxial layer and thereafter a part of the insulating film is removed to form side wall spacers over side walls of the epitaxial layer. Subsequently, with the side wall spacers as masks, a part of the channel layer and that of the drain layer are removed to form a trench for a trench gate.

10 Claims, 18 Drawing Sheets

METHOD OF MANUFACTURING SEMICONDUCTOR DEVICE

CROSS-REFERENCE TO RELATED APPLICATIONS

This application is a continuation of application Ser. No. 12/434,655 filed May 3, 2009, now U.S. Pat. No. 8,030,704 which is a continuation of application Ser. No. 11/958,363 filed Dec. 17, 2007 now U.S. Pat. No. 7,595,242. The present application also claims the priority of Japanese Patent Application No. 2006-354339 filed on Dec. 28, 2006, the disclosure of which, including the specification, drawings and abstract, is incorporated herein by reference in its entirety.

BACKGROUND OF THE INVENTION

The present invention relates to a semiconductor device manufacturing technique. Particularly, the present invention is concerned with a technique applicable effectively to the manufacture of a semiconductor device having a trench gate type power transistor.

It is breakdown voltage and ON resistance that are important characteristics required of a power MOSFET (Metal Oxide Semiconductor Field Effect Transistor). When comparison is made on the basis of the same breakdown voltage, it can be said that the lower the ON resistance, the higher the performance. A loss generated during operation can be decreased by diminishing ON resistance.

As to ON resistance of a low breakdown voltage power MOSFET, a channel resistance developed in a semiconductor layer (silicon layer) is dominant and therefore scaling-down of a cell according to the MOSFET scaling rule is effective for decreasing ON resistance.

On the other hand, as to ON resistance of a high breakdown voltage power MOSFET, the resistance of a drift layer (drain layer) necessary for the attainment of a high breakdown voltage is dominant. Since the Super Junction structure (hereinafter referred to as the "SJ structure") is a structure capable of making the drift layer low in resistance while ensuring a high breakdown voltage and therefore attracts attention of many concerns as a structure effective for decreasing the ON resistance of a high breakdown power MOSFET.

For attaining a low ON resistance there has been proposed a trench gate type wherein a trench is formed and a gate electrode is buried therein to reduce the unit cell area.

In U.S. Pat. No. 5,216,275 (Patent Literature 1) there is described a technique on a trench gate power MOSFET using the SJ structure.

SUMMARY OF THE INVENTION

FIG. 1 is a sectional view of a principal portion of a semiconductor device provided with a trench gate type power transistor using the SJ structure which the present inventors have studied. This power transistor, indicated at Q0, is constituted by a MOSFET and is of the same structure as the MOSFET described in U.S. Pat. No. 5,216,275 (Patent Literature 1).

As shown in FIG. 1, the power transistor Q0 as a single cell is formed on a main surface of a semiconductor substrate Sub which is, for example, an $n^+$ type single crystal silicon substrate. A drain electrode DE is formed on a back surface of the semiconductor substrate Sub. On the other hand, on the main surface of the semiconductor substrate Sub, columnar $n^-$ type drain layers DL and columnar $p^-$ type epitaxial layers EL adjacent thereto are formed in an alternate manner to constitute the SJ structure.

A p type channel layer CL is formed on upper surfaces of the drain and epitaxial layers DL, EL so as to span those layers. Trenches UT are formed so as to extend from an upper surface side of the channel layer and reach the drain layers DL. A gate insulating film GI is formed on side faces and a bottom of each trench UT. Further, a gate electrode GE is formed on the gate insulating film GI so as to fill up the trench UT.

On the upper surface side of the channel layer CL there are formed contact regions CA and an $n^+$ type source region SA is formed between each contact region CA and the gate insulating film GI. A source electrode SE is formed on and electrically connected to the source region SA. The source electrode SE is formed so as to cover the contact region CA from above and also cover the gate electrode GE from above via an insulating film IF3.

In the power transistor Q0, when a positive voltage is applied to the gate electrode GE, a channel is formed in the channel layer CL in a direction along the gate insulating film GI and an electric current is flowed through the source electrode SE, source region SA, channel of the channel layer CL, drain layer DL, semiconductor substrate Sub and drain electrode DE. Moreover, in the power transistor Q0, there is formed a breakdown voltage between the source electrode SE and the drain electrode DE by extending a depletion layer from the pn junction of each $n^-$ type drain layer DL and an associated $p^-$ type epitaxial layer EL to both drain layer DL and epitaxial layer EL.

The power transistor Q0 using such an SJ structure can make ON resistance lower than in a power transistor not using the SJ structure, in case of the same breakdown voltage. This is for the following reason.

In the power transistor not using the SJ structure, for example in FIG. 1, the $p^-$ type epitaxial layer is substituted by the $n^-$ type drain layer DL, that is, the portion under the gate electrode GE is constituted by an $n^-$ type semiconductor layer (drift layer). Breakdown voltage (BVdss) in this structure is determined by an avalanche breakdown of the pn junction between the p type channel layer and the $n^-$ type semiconductor layer (drift layer). In this case, an electric field intensity distribution in the vertical direction (depth direction) within the depletion layer formed in the drift layer is in a state such that it is the strongest in the vicinity of the pn junction and becomes weaker toward the substrate. A required breakdown voltage can be achieved by adjusting the concentration of the $n^-$ type semiconductor layer and the distance (thickness) in the vertical direction.

On the other hand, in the power transistor Q0 using the SJ structure, depletion layers are extended from the pn junctions on both sides of the drain layer DL as the drift layer and an electric field intensity distribution in the vertical direction ideally assumes a uniform state. In a most ideal case, even if the distance (thickness) in the vertical direction of the n type semiconductor layer is made short (thin) to half of the power transistor not using the SJ structure, it is possible to obtain the same breakdown voltage as in the power transistor not using the SJ structure. Even if the impurity concentration of the $n^-$ type drain layer DL is made high within a range which permits complete depletion of the drift layer, it is possible to achieve the same breakdown voltage.

Thus, in the power transistor using the SJ structure, as compared with the power transistor not using the SJ structure, ON resistance can be made low even at the same breakdown voltage.

However, in the event of a lateral displacement of a photomask, causing malalignment, at the time of forming the trench UT which reaches the drain layer DL in the trench gate type power transistor Q0 using the SJ structure, the trench UT may reach the epitaxial layer EL. In this case, when the power transistor Q0 after completion is brought into a conductive state, the epitaxial layer EL also acts as a channel, with consequent increase of ON resistance. On the other hand, if the width of the drain layer DL is made large to prevent the aforesaid malalignment, the cell pitch will become large and so will the chip area.

It is an object of the present invention to provide a trench gate type power transistor of high performance.

The above and other objects and novel features of the present invention will become apparent from the following description and the accompanying drawings.

The following is an outline of a typical mode of the present invention as disclosed herein.

In the semiconductor device manufacturing method of the present invention, a trench for gate is formed by self-align.

The following is a brief description of an effect obtained by the typical mode of the present invention as disclosed herein.

According to one mode of the present invention it is possible to provide a trench gate type power transistor of high performance which permits formation of a trench for gate without malalignment.

DETAILED DESCRIPTION OF PREFERRED EMBODIMENTS

Figure 1:
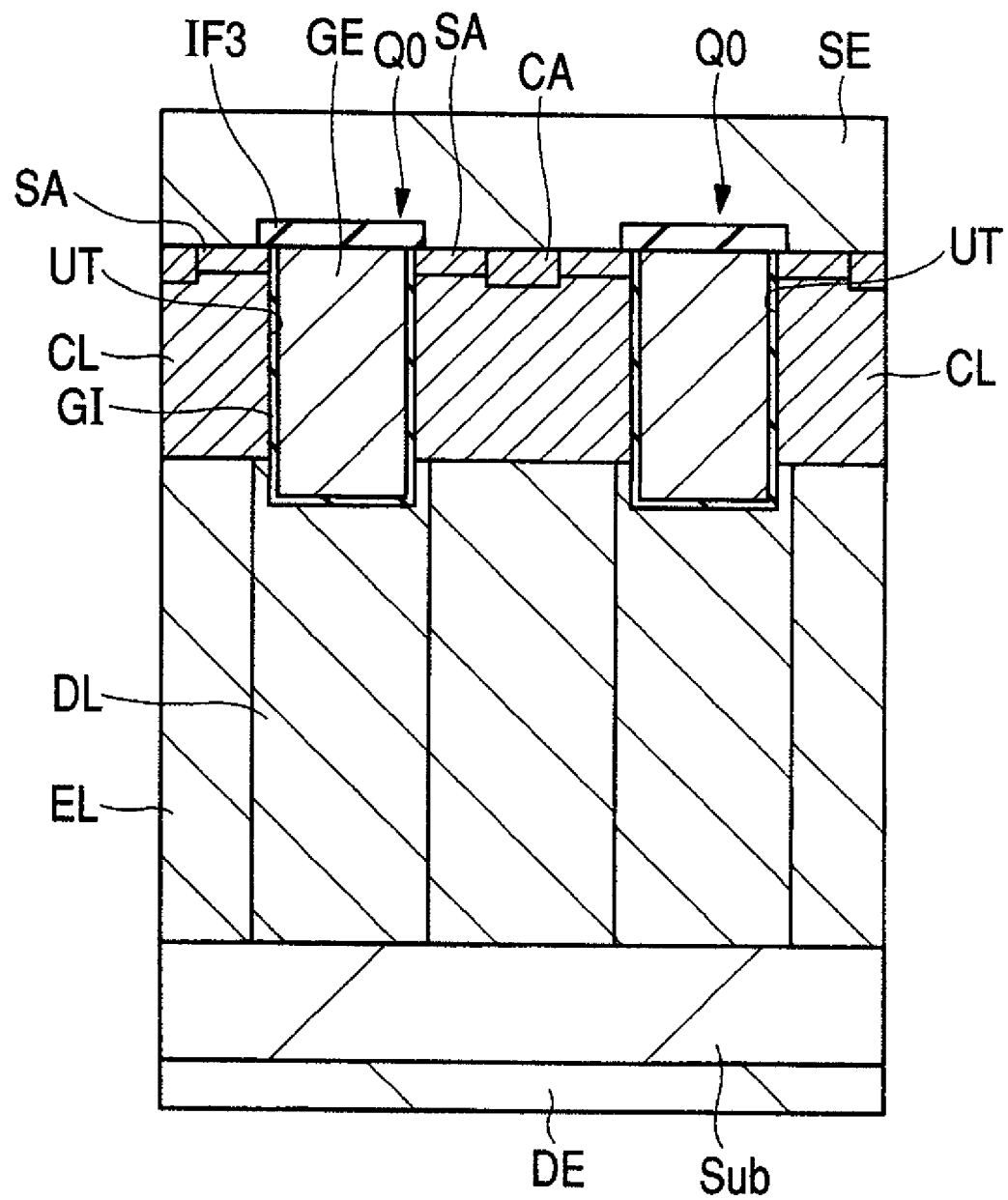
FIG. 1 is a sectional view of a principal portion of a semiconductor device which the present inventors have studied.

Embodiments of the present invention will be described in detail hereinunder with reference to the drawings. In all of the drawings for illustration of the embodiments, the same members are identified by the same reference numerals in principle, and repeated explanations thereof will be omitted.

(First Embodiment)

Figure 2:
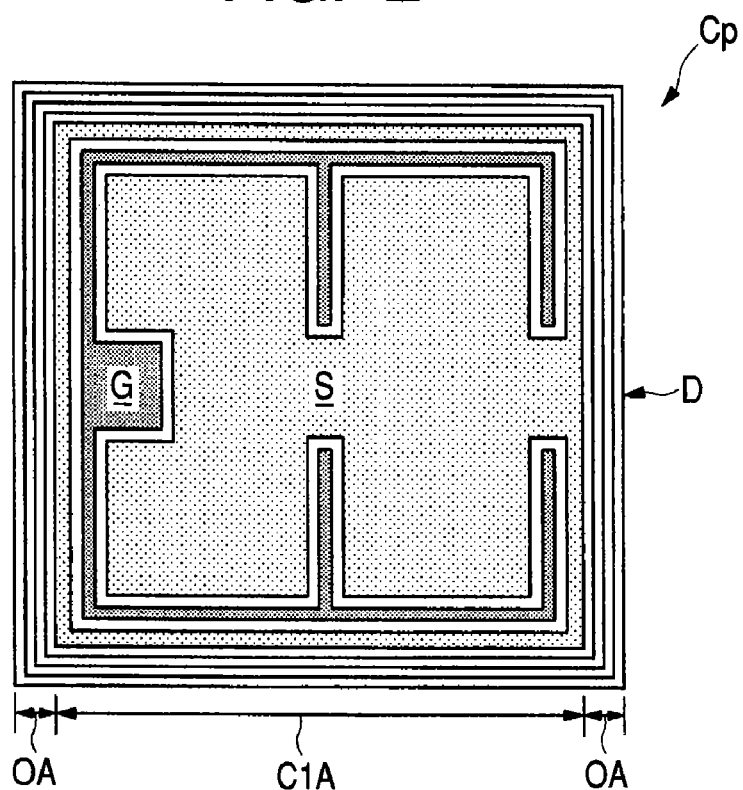
FIG. 2 is a plan view of a chip in a semiconductor device according to a first embodiment of the present invention.
Figure 3:
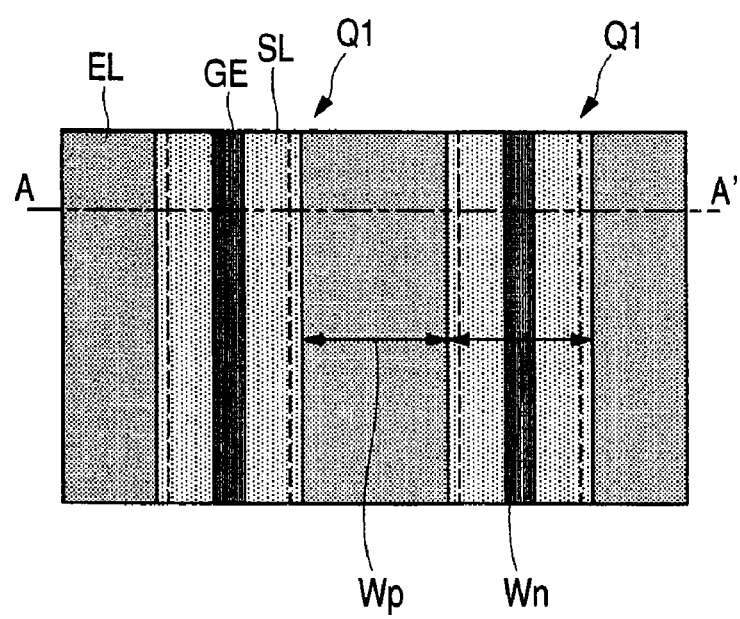
FIG. 3 is an enlarged plan view of a principal portion of FIG. 2.
Figure 4:
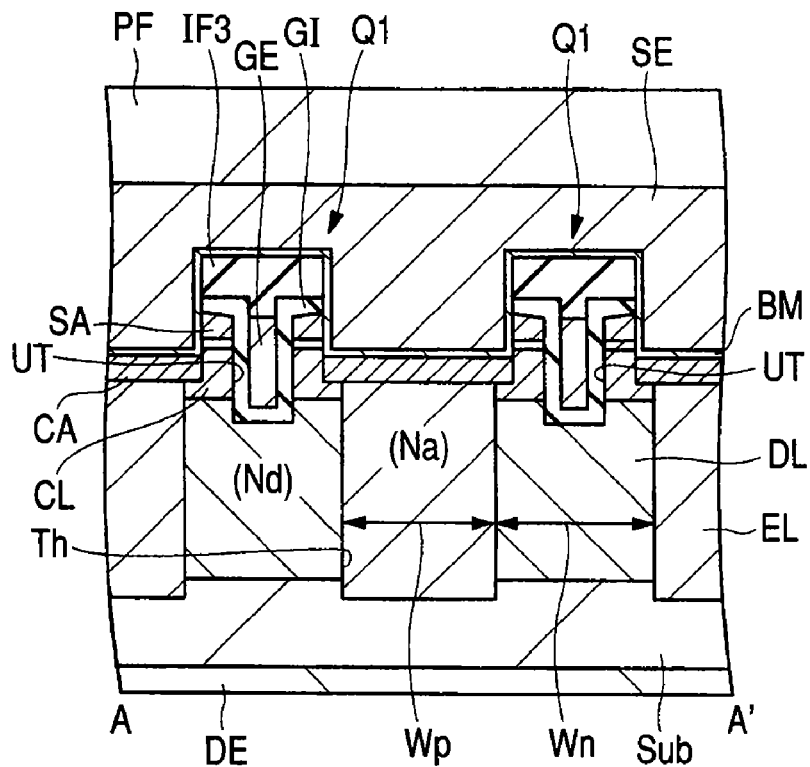
FIG. 4 is a sectional view taken on line A-A' in FIG. 3.

FIG. 2 is a plan view showing a chip condition of a semiconductor device provided with a trench gate type power transistor using the SJ structure according to a first embodiment of the present invention. FIG. 3 is a sectional view of a principal portion of the semiconductor device shown in FIG. 2. FIG. 4 is a sectional view taken on line A-A' of the semiconductor device shown in FIG. 3. The power transistor Q1 according to this first embodiment is constituted by a single cell of MOSFET.

As shown in FIG. 2, a semiconductor chip Cp is provided on its main surface (element-forming surface) side with a cell region C1A and a peripheral region OA around the cell region. The cell region C1A is a region in which plural power transistors Q1 are formed. In the cell region C1A are formed a gate (gate electrode) G and a source (source electrode) S which are electrically connected to gates and sources of those power transistors. The pattern of the gate G and that of the source S are not limited to those shown in FIG. 2. The peripheral region O1 is a region for terminating a depletion layer extending from each power transistor Q1 and is constituted for example by a guard ring. On the other hand, on a back surface (not shown) of the semiconductor chip Cp there is formed a drain (drain electrode, back electrode) D connected electrically to drains of the power transistors Q1 formed in the cell region C1A.

The semiconductor chip Cp is packaged one or plurally in such a manner that the gate, drain and source can be electrically connected to the exterior and is used as a switching device for example in the field of automobiles or the field of electric products.

In each power transistor Q1 formed in the semiconductor chip Cp, as shown in FIGS. 3 and 4, a gate electrode GE extends in a direction parallel to the main surface of the semiconductor chip in FIG. 2 and is formed within a trench UT which is formed in a direction perpendicular to the main surface of the semiconductor chip. On a main surface of a semiconductor substrate Sub, as shown in FIG. 4, columnar n$^-$ type drain layers DL and columnar p$^-$ type epitaxial layers EL adjacent thereto are formed in an alternate manner to constitute the SJ structure. That is, the power transistor Q1 in this first embodiment is a trench gate type MOSFET using the SJ structure.

The configuration of the power transistor Q1 will be described below together with a semiconductor device manufacturing method according to this embodiment. FIGS. 5 to 21 are sectional views of principal portions of the semiconductor device in various manufacturing steps.

Figure 5:
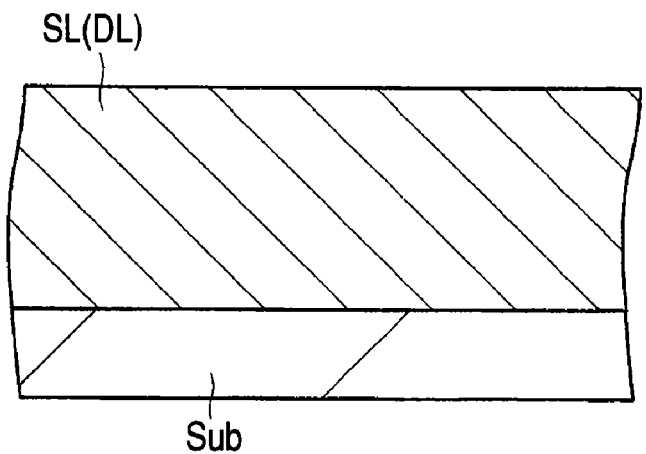
FIG. 5 is a sectional view of a principal portion in a step of a semiconductor device manufacturing process according to the first embodiment.

First, as shown in FIG. 5, a semiconductor device Sub constituted for example by an n$^+$ type single crystal silicon substrate is provided and thereafter a drain layer DL constituted by an n$^-$ type semiconductor layer (a single crystal silicon layer) is formed on the semiconductor substrate Sub by epitaxial growth. At the time of forming the drain layer DL there is made adjustment so as to give a predetermined donor concentration. In FIG. 4, the donor concentration is indicated at Nd.

Figure 6:
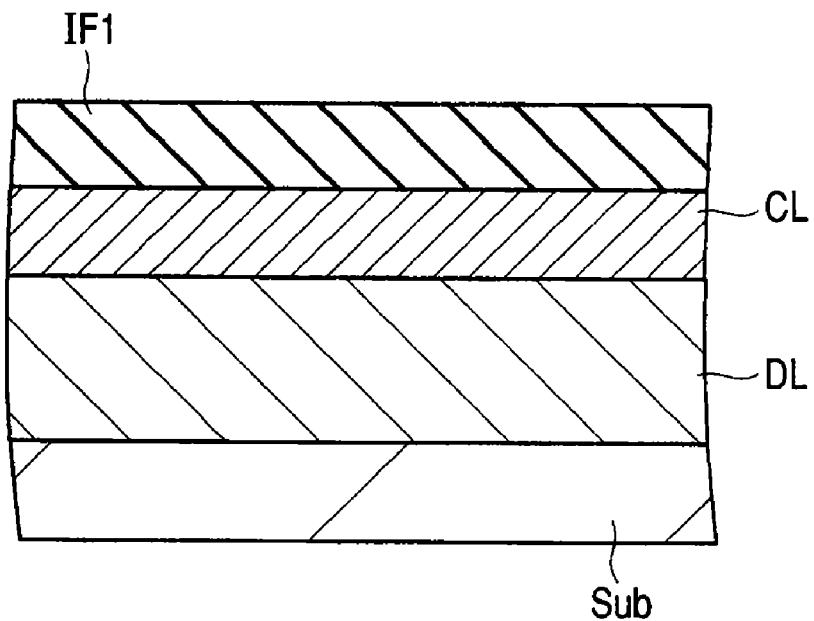
FIG. 6 is a sectional view of a principal portion in another step of the semiconductor device manufacturing process which follows FIG. 5.

Subsequently, as shown in FIG. 6, a p type impurity (e.g., boron (B)) is introduced from an upper surface side of the n$^-$ type semiconductor layer SL (drain layer DL) by ion implantation to form a channel layer CL as a p type semiconductor layer on the drain layer DL. Thereafter, an insulating film IF1 constituted by an oxide film such as, for example, a silicon oxide film, is formed on the channel layer CL by CVD (Chemical Vapor Deposition) for example.

The columnar drain layer DL and columnar epitaxial layer EL shown in FIG. 4 are formed after the formation of the channel layer CL although a description on this point will be given later. For example, if the channel layer CL is formed after formation of the drain layer DL and the epitaxial layer EL, the impurity concentration profile of the drain layer DL and that of the epitaxial layer EL will be impaired by a high-temperature long-time heat treatment. In view of this point, according to this first embodiment, the channel layer CL is formed before the step of forming the drain layer DL and the epitaxial layer EL, whereby the impurity concentration profile of the drain layer DL and that of the epitaxial layer EL can be prevented from being impaired.

Figure 7:
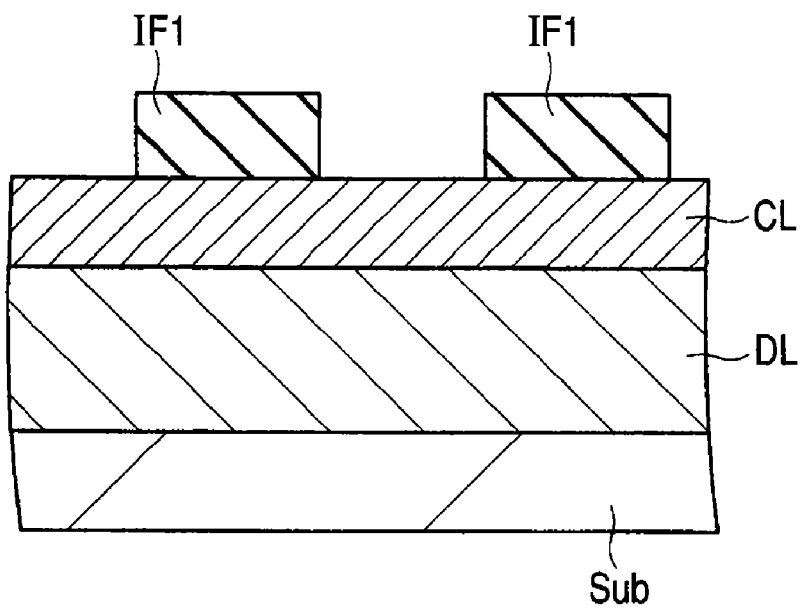
FIG. 7 is a sectional view of a principal portion in a further step of the semiconductor device manufacturing process which follows FIG. 6.
Figure 8:
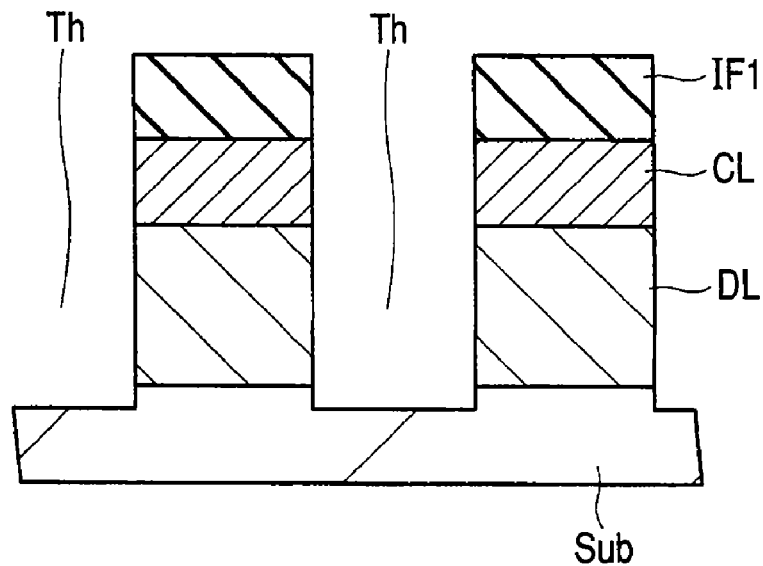
FIG. 8 is a sectional view of a principal portion in a still further step of the semiconductor device manufacturing process which follows FIG. 7.

Next, as shown in FIG. 7, the insulating layer IF1 is patterned by photolithography and etching and thereafter, as shown in FIG. 8, with the insulating film IF1 as a mask, the channel layer CL and the drain layer DL are partially removed to form plural trenches Th reaching the semiconductor substrate Sub. When forming the trenches Th, there is made adjustment so as to give a predetermined size (width). In other words, there is made adjustment so that the width of the drain layer DL which remains unremoved becomes a predetermined width. In FIGS. 3 and 4, the width of the epitaxial layer EL formed in each trench Th and that of the drain layer DL are indicated at Wp and Wn, respectively.

Figure 9:
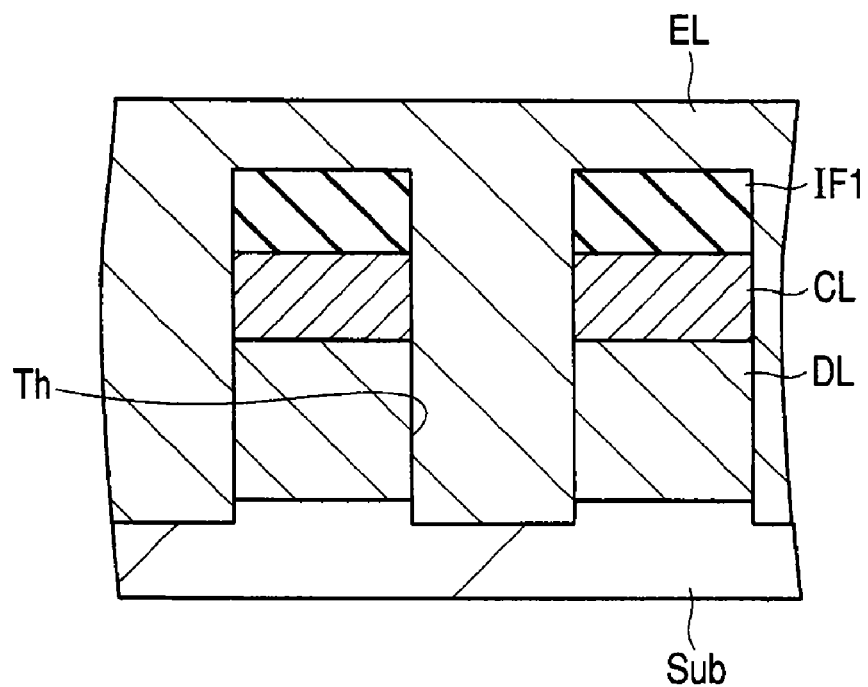
FIG. 9 is a sectional view of a principal portion in a still further step of the semiconductor device manufacturing process which follows FIG. 8.

Then, as shown in FIG. 9, an epitaxial layer EL constituted by a p$^-$ type semiconductor layer is formed within the plural trenches Th and also on the insulating layer IF1 by epitaxial growth. At the time of forming the epitaxial layer EL there is made adjustment so as to give a predetermined acceptor concentration. In FIG. 4, the acceptor concentration is indicated at Na. In this epitaxial growth, polycrystalline silicon may be formed on the insulating film IF1 present within the epitaxial layer EL. However, it suffices for the epitaxial layer (single crystal silicon layer) to be formed within each trench.

Figure 10:
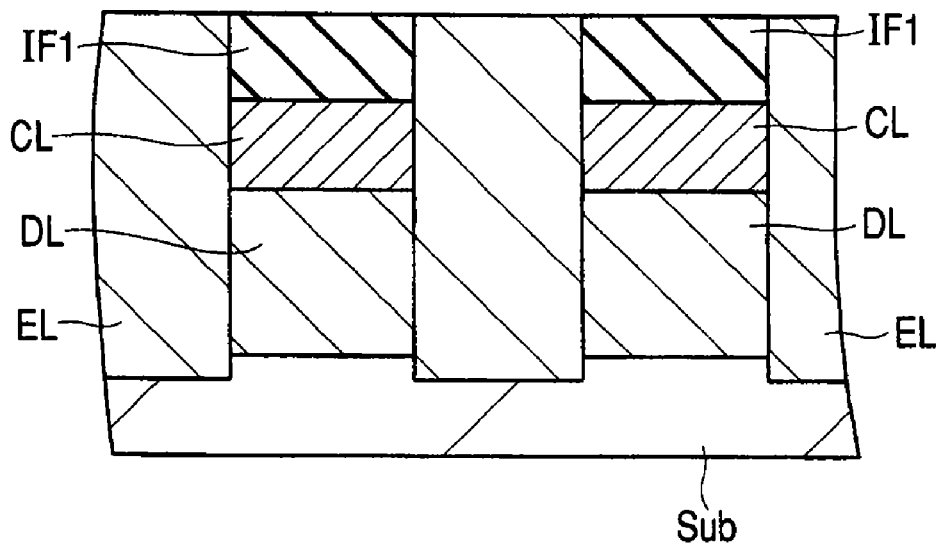
FIG. 10 is a sectional view of a principal portion in a still further step of the semiconductor device manufacturing process which follows FIG. 9.
Figure 11:
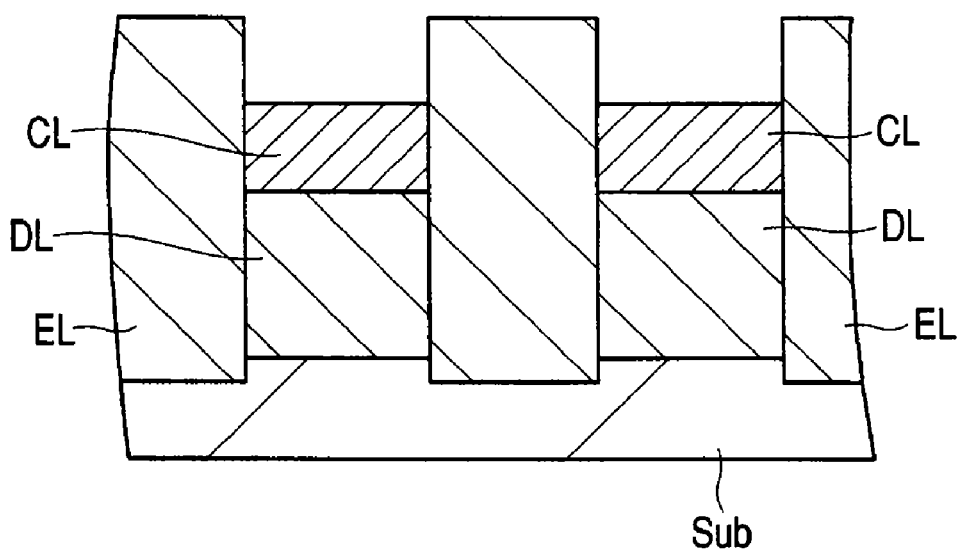
FIG. 11 is a sectional view of a principal portion in a still further step of the semiconductor device manufacturing process which follows FIG. 10.

Subsequently, as shown in FIG. 10, part of the epitaxial layer EL is removed by, for example, CMP (Chemical Mechanical Polishing) or etch back to expose an upper surface of the insulating film IF1, then, as shown in FIG. 11, the insulating film 11 is removed so that an upper surface of the epitaxial layer EL becomes higher than that of the channel layer CL. The shape of the trench UT in which the gate electrode GE is formed as in FIG. 4 depends on the height of the projecting upper portion of the epitaxial layer EL.

Figure 12:
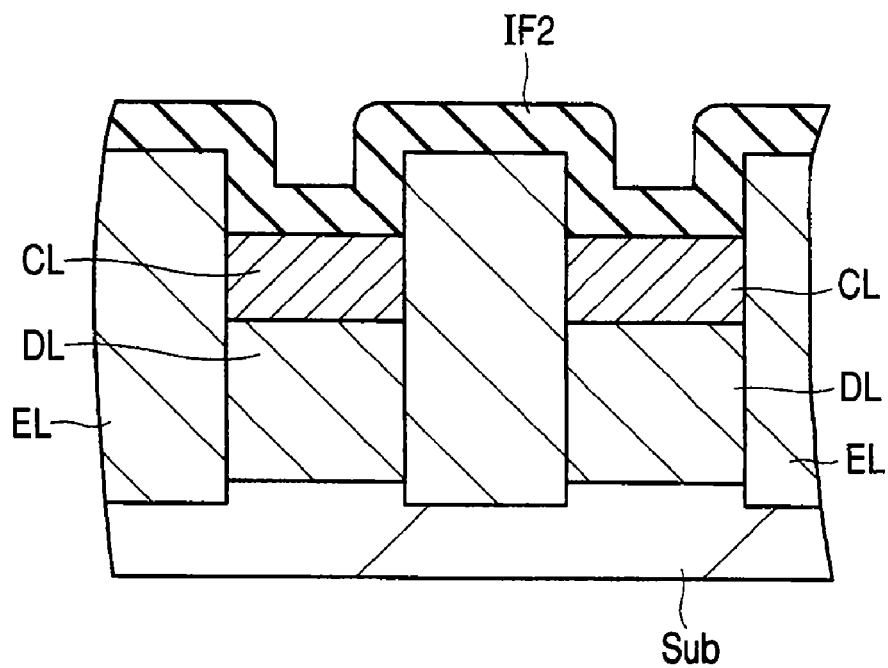
FIG. 12 is a sectional view of a principal portion in a still further step of the semiconductor device manufacturing process which follows FIG. 11.
Figure 13:
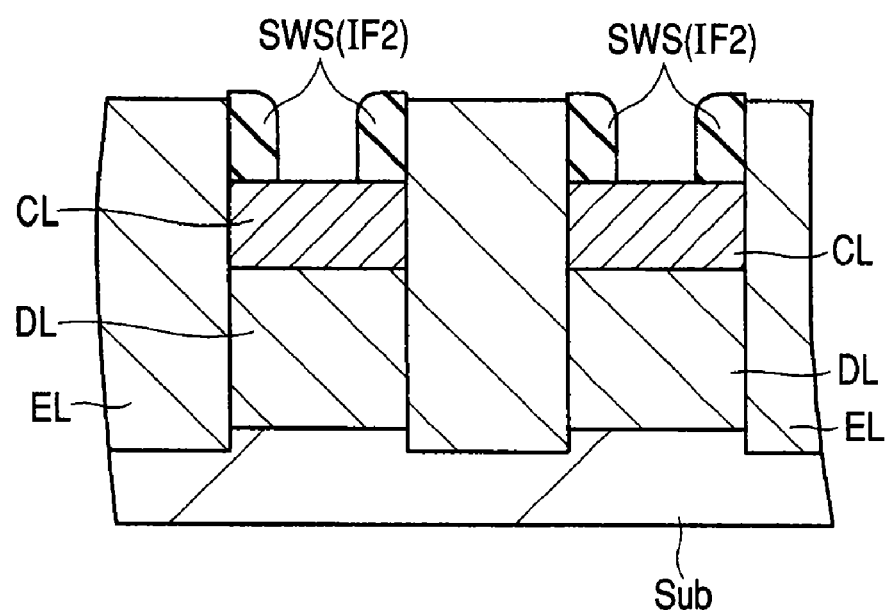
FIG. 13 is a sectional view of a principal portion in a still further step of the semiconductor device manufacturing process which follows FIG. 12.

Next, as shown in FIG. 12, an insulating film IF2 which is a silicon oxide film is formed on both channel layer C1 and epitaxial layer EL by CVD for example and thereafter a part of the insulating film IF2 is removed by anisotropic etching to form side wall spacers SWS on upper side wall portions of the projecting epitaxial layer EL. The side wall spacers SWS are formed on the channel layer CL. As a result of this anisotropic etching a part of the upper surface of the channel layer CL is exposed. The width of the trench UT with the gate electrode GE formed therein as in FIG. 4 is adjusted by changing the thickness of the insulating film IF2.

Figure 14:
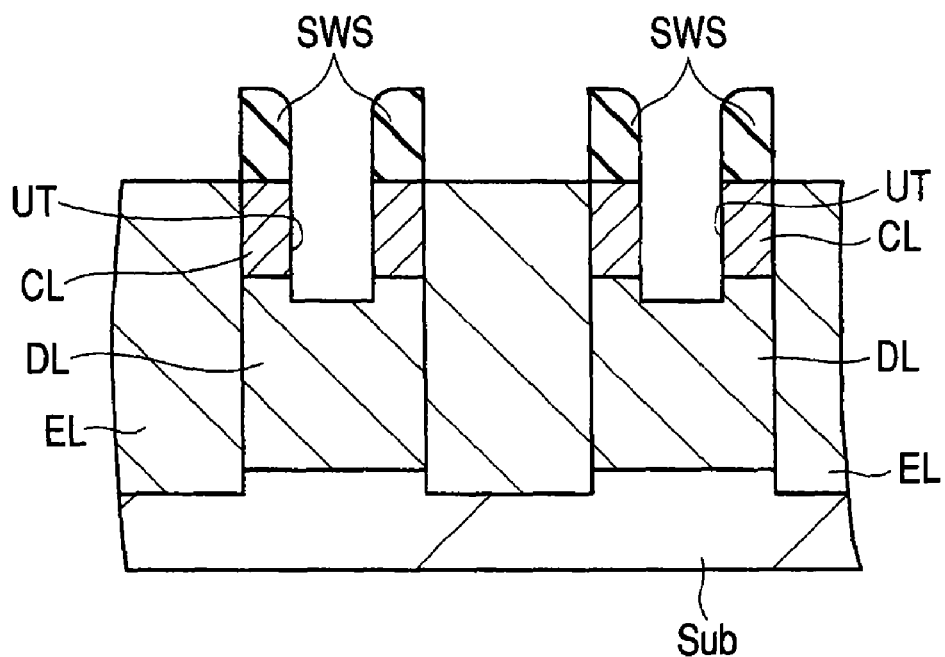
FIG. 14 is a sectional view of a principal portion in a still further step of the semiconductor device manufacturing process which follows FIG. 13.

Then, as shown in FIG. 14, a part of the channel layer CL and that of the drain layer DL are removed by etching with the side wall spacers SWS as masks to form the trench UT for the gate electrode GE shown in FIG. 4. As a result of this etching, not only a part of the channel layer CL and that of the drain layer DL, but also a part (upper portion) of the epitaxial layer EL which is also a single crystal silicon layer is removed.

Thus, the trench UT is formed by self-align. In the power transistor Q0 which the present inventors have studied with reference to FIG. 1, in the event malalignment should occur as a result of lateral displacement of a photomask at the time of forming the trench UT which reaches the drain layer DL, the trench UT may reach the epitaxial layer EL. Consequently, when the power transistor Q0 is rendered conductive, the epitaxial layer EL also acts as a channel, with consequent increase of ON resistance. In this first embodiment, however, since the trench UT is formed by etching with the side wall spacers SWS as masks, i.e., by self-align, malalignment does not occur and, when the power transistor Q1 is rendered conductive, it is possible to prevent an increase of ON resistance which is caused by the action as a channel of the epitaxial layer EL.

The margin from the trench UT for gate up to the epitaxial layer EL can be easily set at 0.5 μm or less (about 1.0 μm or less on both sides of the trench because the margin means that a one-side margin of the trench is 0.5 μm). Forming the trench width to about 0.5 μm is also relatively easy with the technique available at present. The width Wn (see FIG. 4) of the drain layer DL corresponds to the distance which is the sum of the both-side margin and the trench width and therefore it is possible to satisfy the condition of Wn=1.5 μm by using such a self-align. Reducing (narrowing) the width Wn of the drain layer DL is advantageous in that complete depletion can be achieved even if the impurity concentration of the drain layer DL is made high and that therefore ON resistance can be decreased without lowering of breakdown voltage. There also is a merit such that the cell pitch can be narrowed and therefore it is possible to decrease ON resistance.

Figure 15:
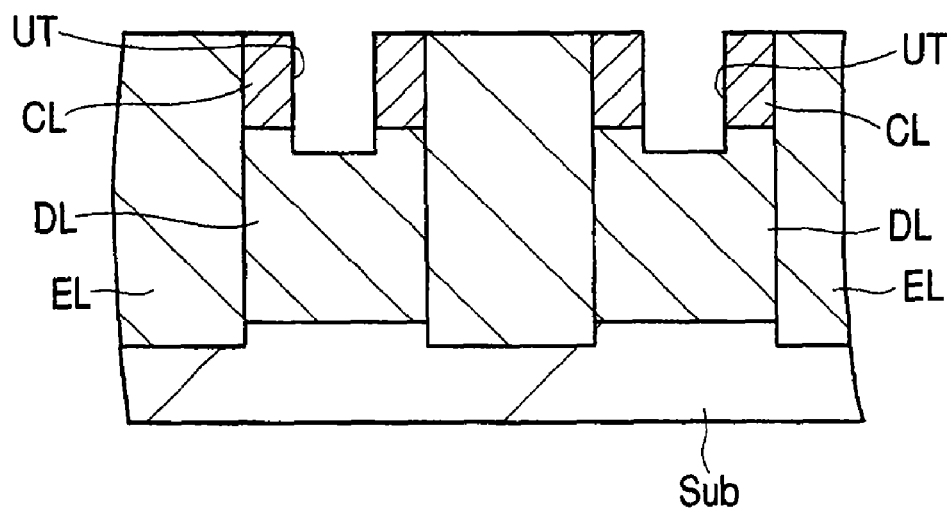
FIG. 15 is a sectional view of a principal portion in a still further step of the semiconductor device manufacturing process which follows FIG. 14.
Figure 16:
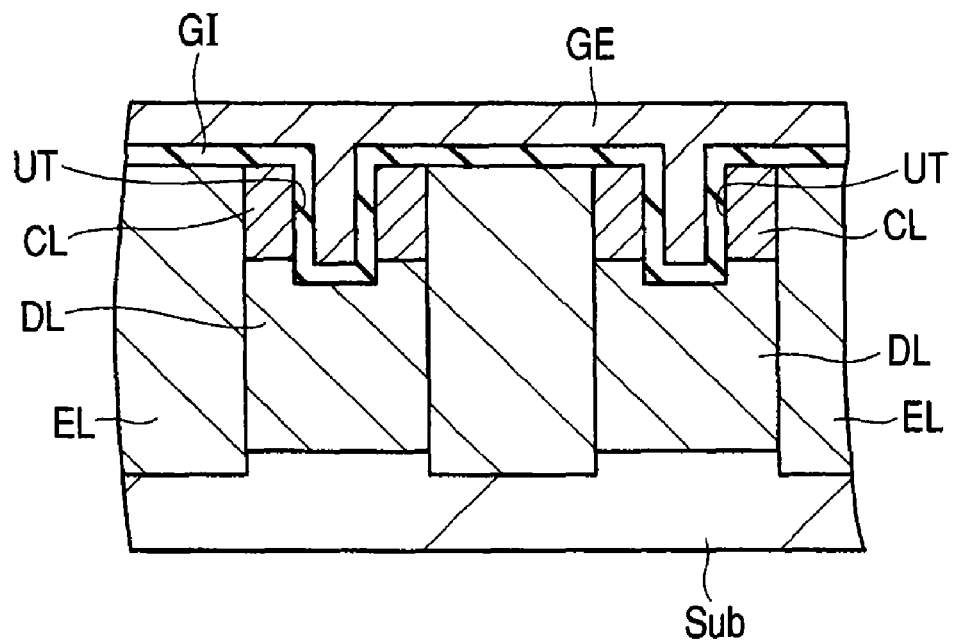
FIG. 16 is a sectional view of a principal portion in a still further step of the semiconductor device manufacturing process which follows FIG. 15.
Figure 17:
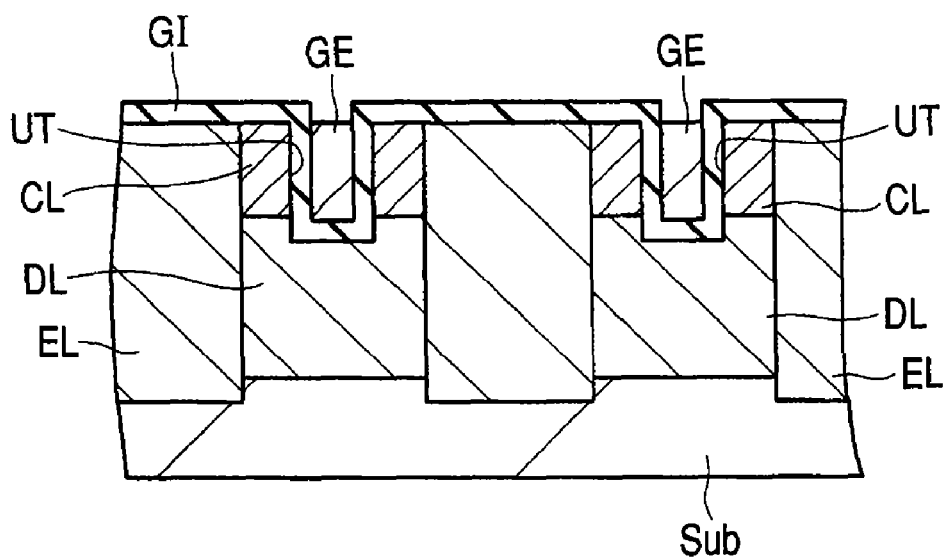
FIG. 17 is a sectional view of a principal portion in a still further step of the semiconductor device manufacturing process which follows FIG. 16.

Subsequently, as shown in FIG. 15, the side wall spacers SWS are removed. Then, as shown in FIG. 16, a gate insulating film GI which is a silicon oxide film is formed within the trench UT by CVD for example, followed by formation of a polycrystalline silicon film serving as a gate electrode GE by CVD for example on the gate insulating film FI. Next, as shown in FIG. 17, a gate electrode GE is formed on the gate insulating film GI by etching in such a manner that the polycrystalline silicon film is allowed to remain only within the trench UT. When forming the gate electrode GE, a draw-out portion (not shown) of the gate electrode GE is formed using a mask which is a photoresist mask.

Figure 18:
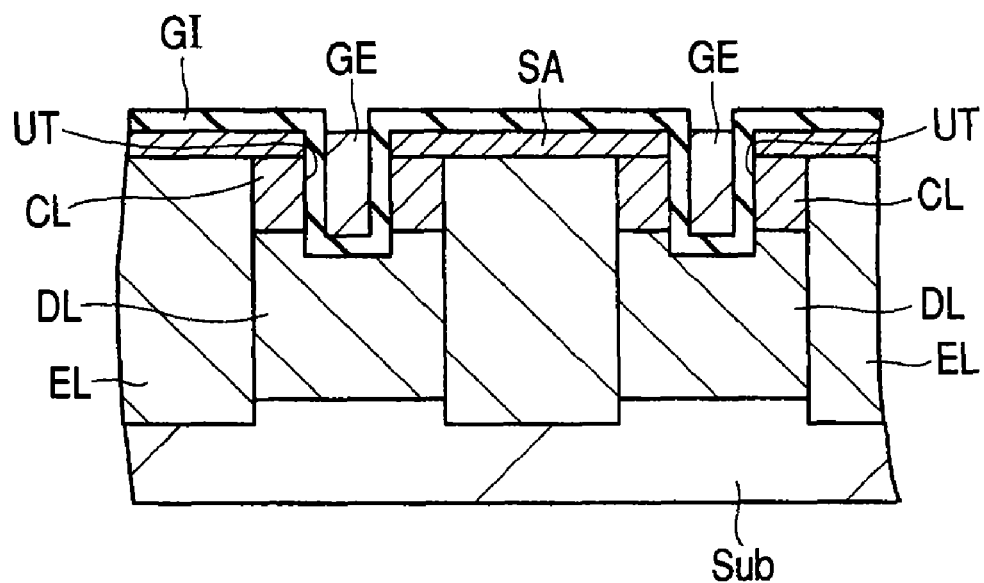
FIG. 18 is a sectional view of a principal portion in a still further step of the semiconductor device manufacturing process which follows FIG. 17.

Then, as shown in FIG. 18, an n type impurity (e.g., arsenic (As))) is introduced from the upper surface side of the channel layer CL by ion implantation to form a source region SA as an $n^+$ type semiconductor layer on top of both channel layer CL and epitaxial layer EL. By this ion implantation the polycrystalline silicon film which constitutes the gate electrode GE comes to have electric conductivity. Modification may be made such that the polycrystalline silicon film which constitutes the gate electrode GE comes to have electric conductivity when it is formed.

Figure 19:
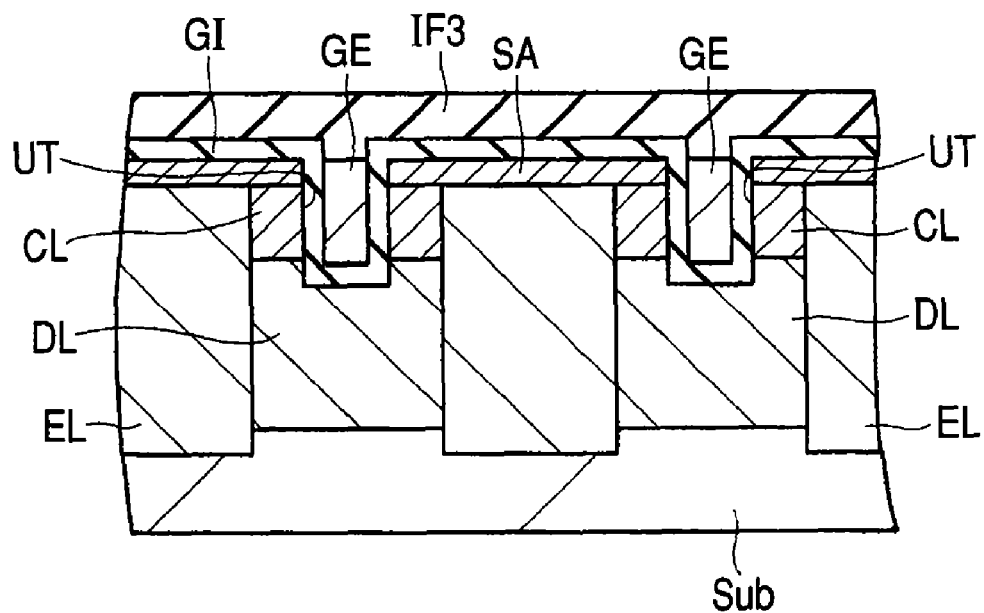
FIG. 19 is a sectional view of a principal portion in a still further step of the semiconductor device manufacturing process which follows FIG. 18.
Figure 20:
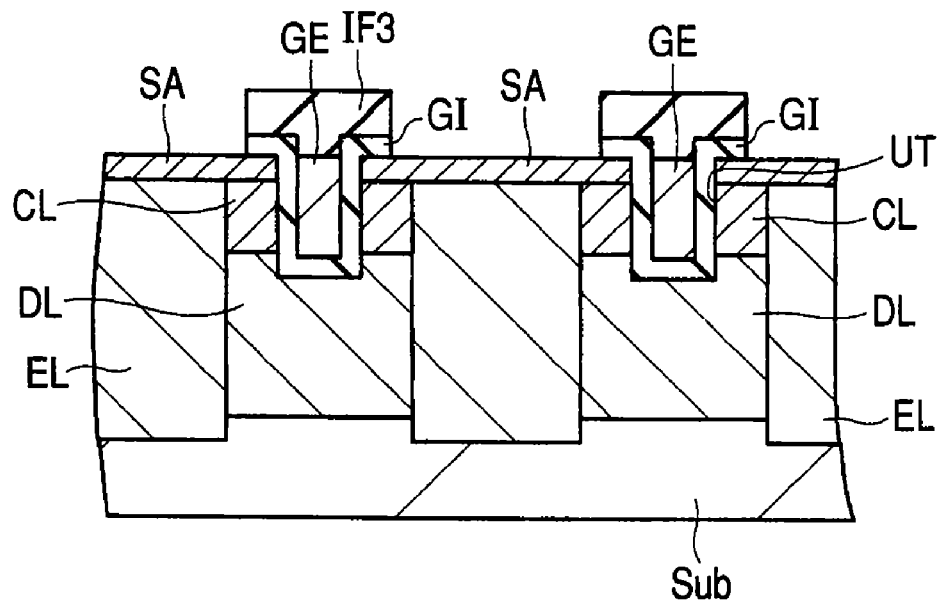
FIG. 20 is a sectional view of a principal portion in a still further step of the semiconductor device manufacturing process which follows FIG. 19.

Next, as shown in FIG. 19, an insulating film IF3 which is a silicon oxide film is formed on the gate electrode GE by CVD for example and is thereafter subjected to patterning by photolithography and etching as shown in FIG. 20. The insulating film IF3 serves as an interlayer insulating film for insulation between the gate electrode GE and the source electrode SE both shown in FIG. 4.

Figure 21:
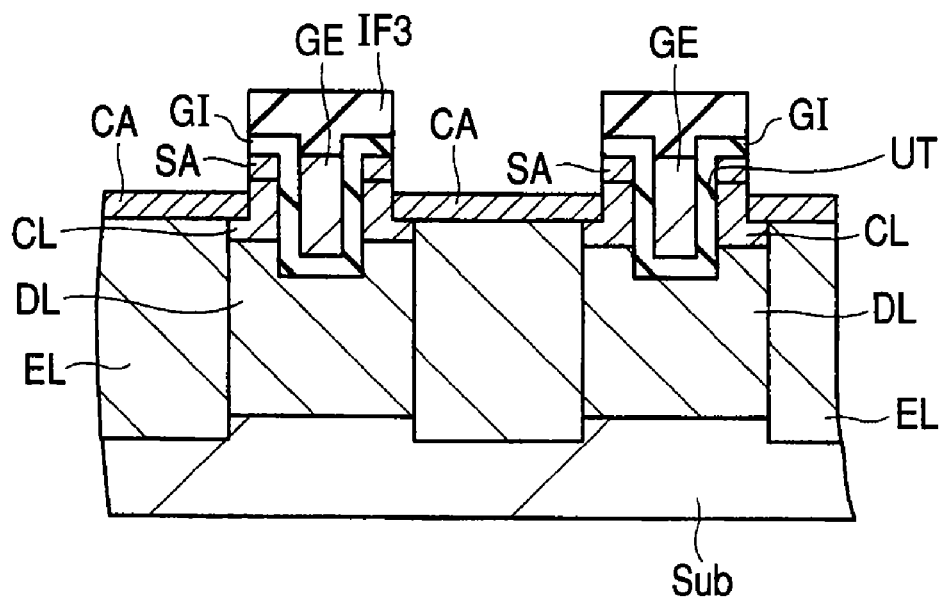
FIG. 21 is a sectional view of a principal portion in a still further step of the semiconductor device manufacturing process which follows FIG. 20.

Subsequently, as shown in FIG. 21, a part of the source region SA is removed in a piercing manner by etching with use of the insulating film IF3 as a mask, allowing the upper surface of the epitaxial layer EL and that of a part of the channel layer CL to be exposed. Thereafter, a p type impurity is introduced by ion implantation from the thus-exposed upper surface of the epitaxial layer and upper surface of a part of the channel layer CL to form a contact region CA which is a $p^+$ type semiconductor layer. The remaining source region SA functions as a source of the power transistor Q1 shown in FIG. 4. The contact region acts as a body contact.

Thus, in this first embodiment, the source region SA which functions as the source is formed after forming the gate electrode GE as the trench electrode. For example, when the source region SA (see FIG. 4) which functions as the source is already present on the channel layer CL in the epitaxial growth process of forming the epitaxial layer EL described above in connection with FIG. 9, it is presumed that the following may occur by auto doping. That is, it may become impossible to obtain a desired impurity concentration due to introduction of an unexpected impurity (e.g., arsenic (As)) in the source region SA into the epitaxial layer EL and it may become easier for a crystal defect to occur in the epitaxial layer EL at a position near the interface with the source region SA.

Then, as shown in FIG. 4, barrier metal BM is formed by sputtering so as to cover upper surfaces of the contact region CA and the insulating film IF3 and thereafter a source electrode SE constituted by an aluminum (Al) film is formed on the barrier metal BM by sputtering. Further, a protective film PF constituted by a polyimide film is formed by spin coating, then a back surface of the semiconductor substrate Sub is polished and thereafter a drain electrode (back electrode) DE is formed by sputtering. In this way the power transistor Q1 according to this first embodiment is completed.

Next, characteristics of the power transistor Q1 thus having gone through the above manufacturing process will be described below together with the operation thereof.

First, with reference to FIG. 4, a description will be given of the operation for obtaining the breakdown voltage of the power transistor Q1. 0V is applied to both gate electrode GE and source electrode SE and voltage is applied to the drain electrode DE. At this time, a depletion layer extends from the pn junction between the $n^-$ type drain layer DL constituted by the SJ structure and the $p^-$ type epitaxial layer EL. When a predetermined voltage is applied to the drain, both drain layer DL and epitaxial layer EL are depleted completely. At this instant, the electric field intensity in the vertical direction within the depletion layer is uniform ideally. When the electric field intensity reaches a critical level, there occurs an avalanche breakdown and the voltage detected at this time corresponds to a breakdown voltage (BVdss). Thus, in the power transistor Q1 using the SJ structure with alternate drain and epitaxial layers DL, EL, a high breakdown voltage can be obtained by extending a depletion layer from the pn junction on each side of the drain layer DL.

Figure 22:
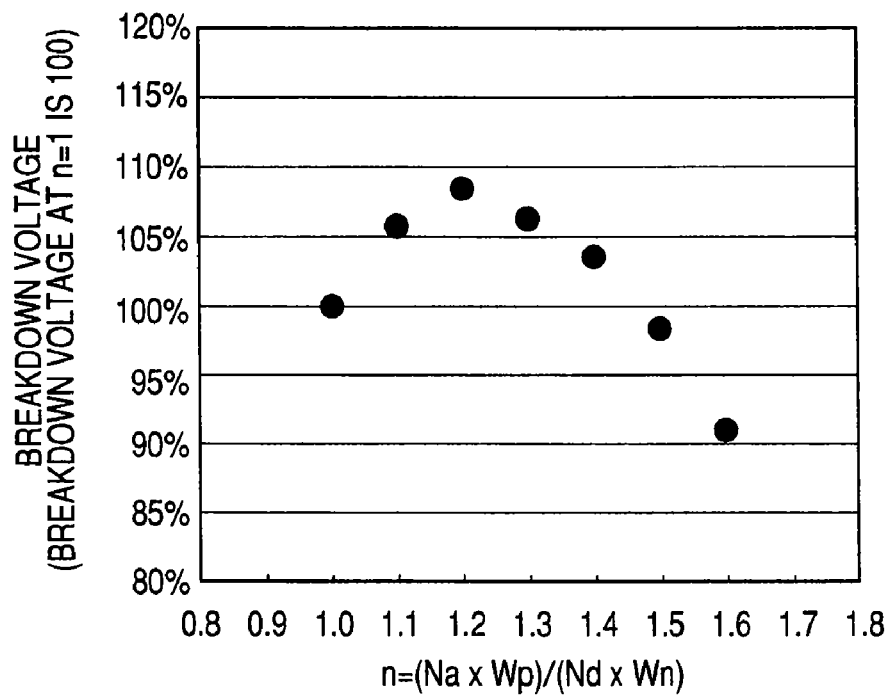
FIG. 22 is a diagram for explaining breakdown voltage characteristics obtained with various changes in doner concentration of a drain layer, acceptor concentration of an epitaxial layer, width of the drain layer and that of the epitaxial layer.

It is assumed that the donor concentration of the drain layer DL is Nd, the acceptor concentration of the epitaxial layer EL is Na, the width of the drain layer DL is Wn and that of the epitaxial layer EL is Wp. In order to deplete the drain layer DL and the epitaxial layer EL completely it is desirable that n=1 in the expression Na×Wp=n×Nd×Wn with n being a coefficient. However, in the case where a trench gate (gate electrode GE) is present, the breakdown voltage varies with a change of the coefficient n, as shown in FIG. 22. Thus, the presence of the trench gate may obstruct the attainment of an ideal, uniform electric field distribution.

Figure 23:
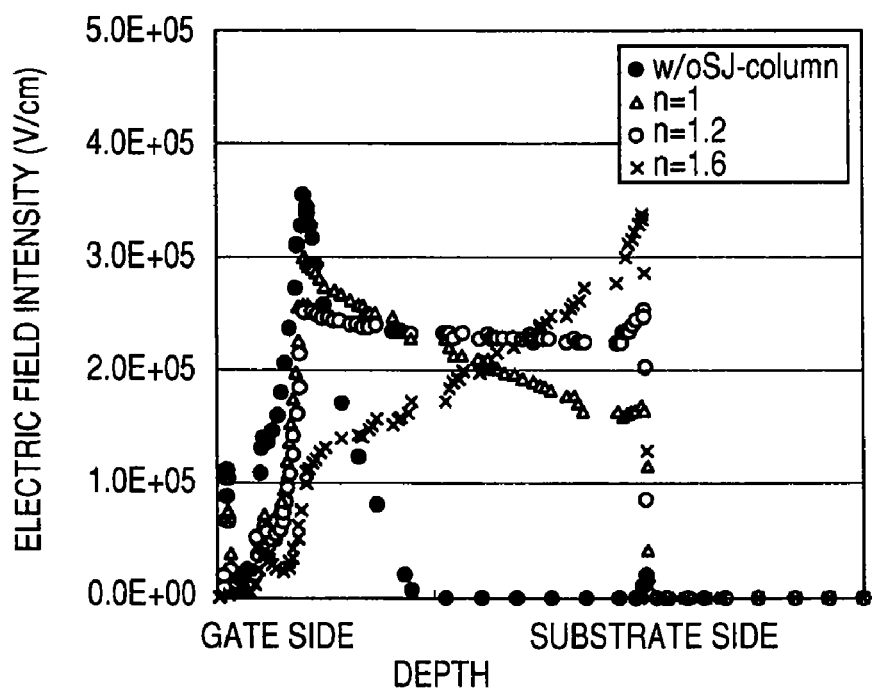
FIG. 23 is a diagram for explaining electric field intensity characteristics in the depth direction of the drain layer.

Since the breakdown voltage is a voltage obtained by integrating the electric field intensity distribution upon arrival at the critical level by distance, it can be said that the more uniform the electric field intensity, the higher the breakdown voltage of the device structure concerned. FIG. 23 illustrates an electric field intensity in the depth direction of the drain layer DL. Parameters in FIG. 23 are n=1, 1.2, 1.6 and a trench gate type power transistor (w/o SJ-column in the figure) not using the SJ structure.

From FIG. 23 it is seen that when the SJ structure is not used and with n=1, the electric field is strengthened in the drain layer DL under the trench gate electrode GE and thereabouts, not affording a uniform electric field intensity distribution. Likewise, with n=1.6, the electric field intensity in the vicinity of the semiconductor substrate Sub which is high in concentration becomes high and a uniform electric field intensity distribution is not obtained. On the other hand, in case of n=1.2, the electric field intensity distribution can be said uniform. Thus, it can be said that there exists an optimum value of n in order to make the electric field intensity distribution uniform and attain a high breakdown voltage. Therefore, by setting n at a value of 1.1 to 1.35, the breakdown voltage can be made high about 5% in comparison with that at n=1, as shown in FIG. 22. Further, when it is taken into account that ON resistance is to be decreased, it is better to ensure a wide current path upon turning ON and hence it is preferable to meet the relationship Wp=Wn.

In this first embodiment, for example in case of forming a power transistor Q1 with a breakdown voltage of about 200V, the condition of n=1.2 can be satisfied by setting Nd at 1.0 E16 cm$^{-3}$ in the manufacturing step described above in connection with FIG. 5, Na at 1.2 E16 cm$^{-3}$ in the manufacturing step described above in connection with FIG. 9 and Wp and Wn at 1.0 μm in the manufacturing step described above in connection with FIG. 8.

Next, a conducting operation of the power transistor Q1 will be described with reference to FIG. 4. A positive voltage is applied from the drain electrode DE to the semiconductor substrate Sub which is an n$^+$ type single crystal silicon substrate, while 0V is applied (connected to ground) from the source electrode SE to the source region SA formed by an n$^+$ type semiconductor layer and also to the contact region CA formed by a p$^+$ type semiconductor layer. If in this state a positive voltage is applied to the gate electrode GE, electrons present within the channel layer CA formed by a p type semiconductor layer gather on the gate insulating film GI side and an n type channel is formed along the gate insulating film GI. As a result, electrons fed from the n$^+$ type source region SA (source electrode SE) pass through the n type channel and the drain layer DL formed by an n$^-$ type semiconductor layer in this order and reach the n+type semiconductor substrate Sub (drain electrode DE), so that the power transistor Q1 turns conductive.

As noted previously, in the process of manufacturing the power transistor Q1, the trench UT which reaches the drain layer DL is formed by self-align using the side walls spacers SWS without using a mask. Consequently, malalignment does not occur and the trench UT reaching the epitaxial layer EL and the gate electrode EG are not formed. Therefore, while the power transistor Q1 is ON, the p$^-$ type epitaxial layer EL does not act as a channel. Thus, the electrons fed from the n$^+$ type source region SA pass through the n type channel and the drain layer DL formed by an n$^-$ type semiconductor layer in this order, so that it is possible to prevent an increase in ON resistance of the power transistor Q1 which is caused by the epitaxial layer EL acting as a channel. That is, it is possible to attain high performance of the trench gate type power transistor Q1 using the SJ structure. Moreover, since such widening of the drain layer DL as in the use of a photomask is not needed, it is not necessary to enlarge the cell pitch and the chip area.

(Second Embodiment)

In the above first embodiment a description has been given about the case where the epitaxial layer EL is formed after forming the channel layer CL. In this second embodiment a description will be given about the case where the channel layer CL is formed after forming the p$^-$ type epitaxial layer.

With reference to FIGS. 24 to 30, a description will be given below about a method of manufacturing a semiconductor device provided with a trench gate type power transistor using the SJ structure according to this second embodiment. Manufacturing steps prior to the manufacturing step illustrated in FIG. 24 correspond to the manufacturing steps of FIGS. 5 to 15, provided the channel layer CL is not formed in the semiconductor layer SL (drain layer DL) in the manufacturing step described above in connection with FIG. 6. Therefore, explanations of those manufacturing steps will be omitted.

Figure 24:
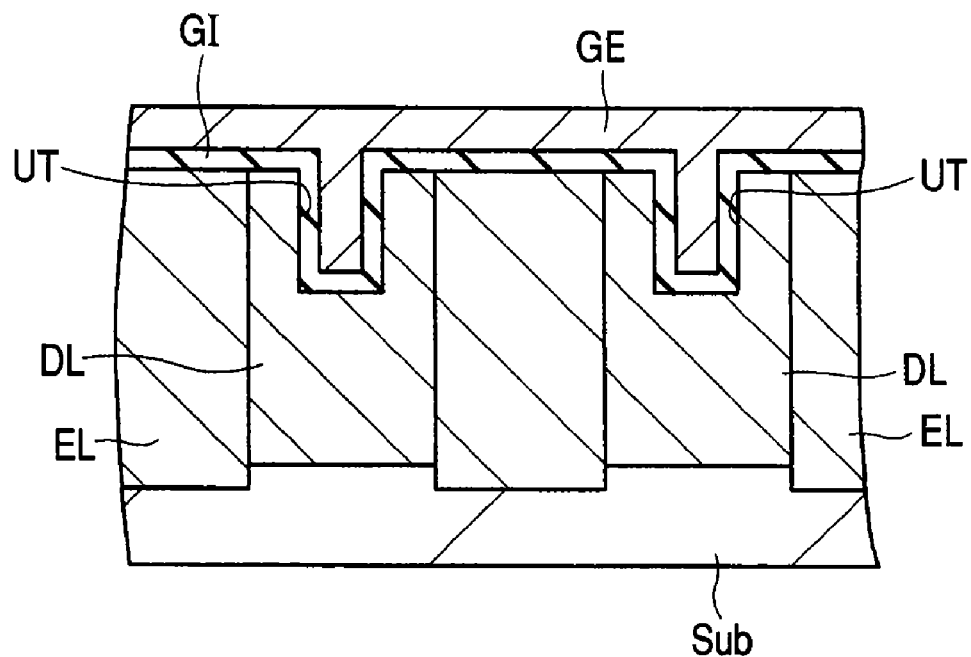
FIG. 24 is a sectional view of a principal portion in a step of a semiconductor device manufacturing process according to a second embodiment of the present invention.
Figure 25:
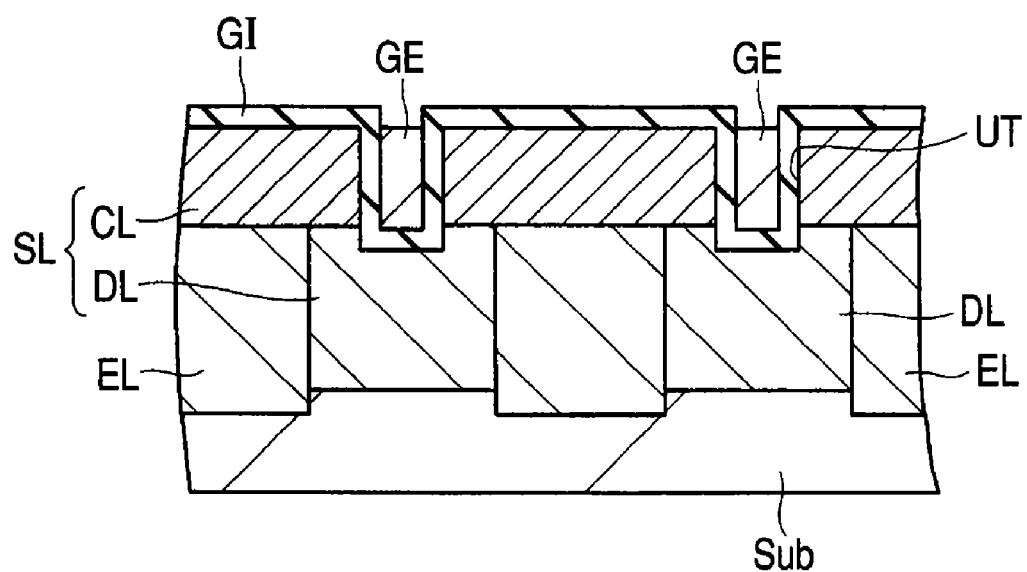
FIG. 25 is a sectional view of a principal portion in another step of the semiconductor device manufacturing process which follows FIG. 24.

As shown in FIG. 24, a gate insulating film GI which is a silicon oxide film is formed within each trench UT by CVD for example and thereafter a polycrystalline silicon film serving as a gate electrode GE is formed on the gate insulating film GI by CVD for example. Then, as shown in FIG. 25, a gate electrode GE is formed on the gate insulating film GI by etching in such a manner that the polycrystalline silicon film is allowed to remain only within each trench UT. Thereafter, a p type impurity (e.g., boron) is introduced from the upper surface side of both drain layer DL and epitaxial layer EL by high energy ion implantation and a channel alyer CL is formed on each of drain layer DL and epitaxial layer EL by RTA (Rapid Thermal Anneal). When forming the gate electrode GE, a draw-out portion (not shown) of the gate electrode GE is formed using a mask which is a photoresist mask.

Figure 26:
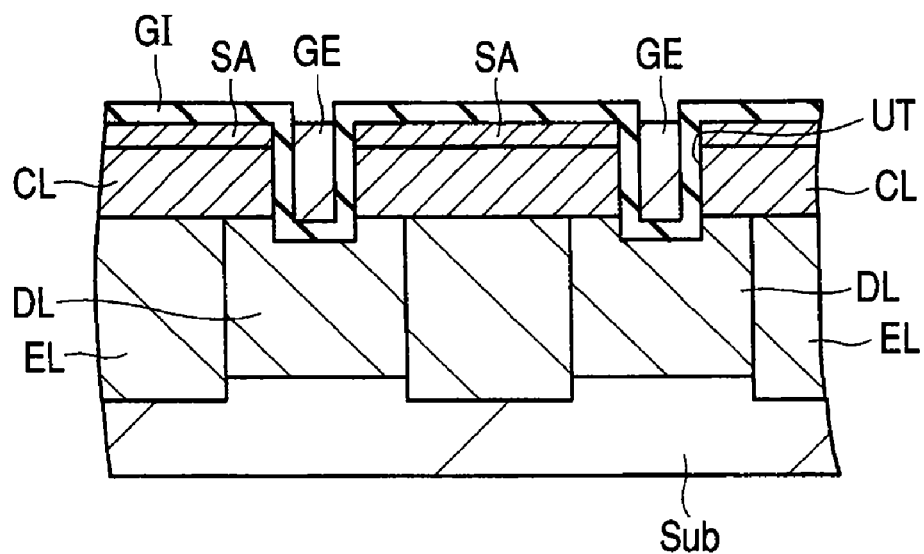
FIG. 26 is a sectional view of a principal portion in a further step of the semiconductor device manufacturing process which follows FIG. 25.
Figure 27:
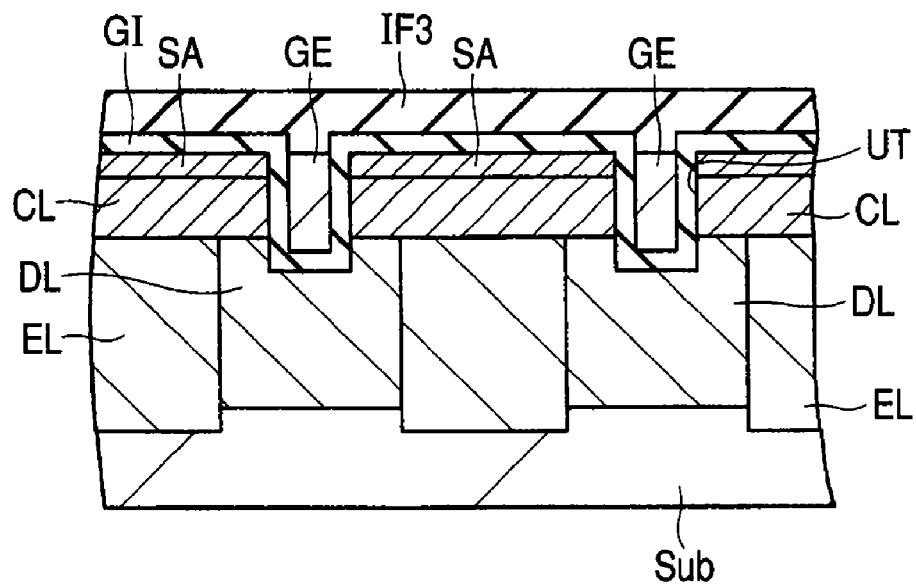
FIG. 27 is a sectional of a principal portion in a still further step of the semiconductor device manufacturing process which follows FIG. 26.
Figure 28:
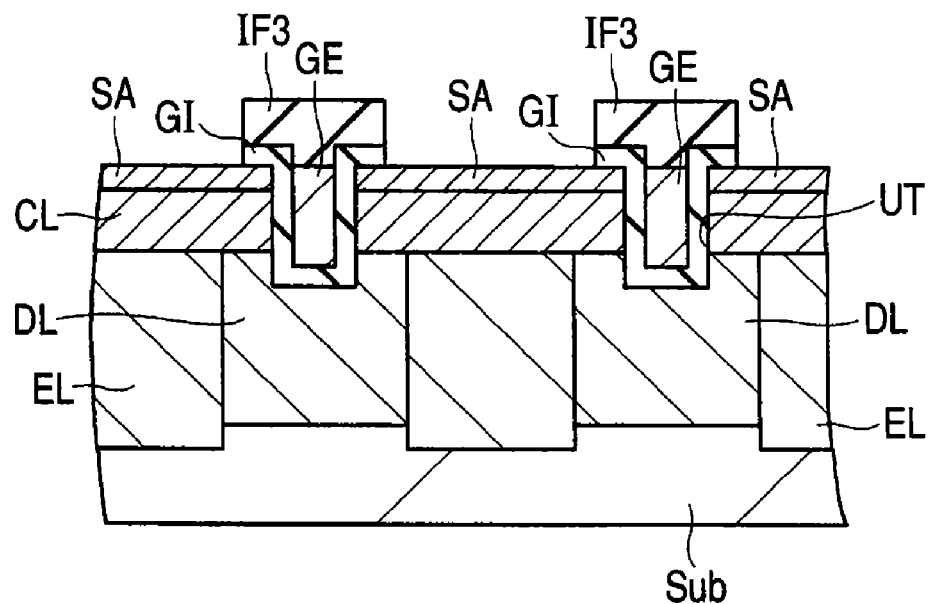
FIG. 28 is a sectional view of a principal portion in a still further step of the semiconductor device manufacturing process which follows FIG. 27.

Subsequently, as shown in FIG. 26, an n type impurity (e.g., arsenic (As)) is introduced by ion implantation to form a source region SA constituted by an n$^+$ type semiconductor layer. Next, as shown in FIG. 27, an insulating film IF3 which is a silicon oxide film is formed on the gate electrode GE by CVD for example. Thereafter, as shown in FIG. 28, the insulating film IF3 is subjected to patterning by photolithography and etching.

Figure 29:
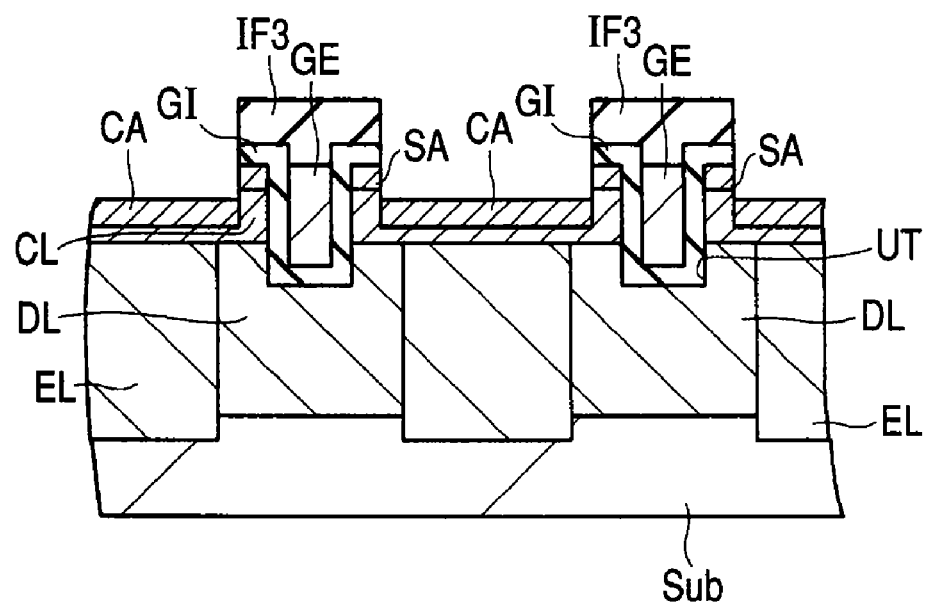
FIG. 29 is a sectional view of a principal portion in a still further step of the semiconductor device manufacturing process which follows FIG. 28.

Next, as shown in FIG. 29, a part of the source region SA is removed in a piercing manner by etching through the insulating film IF3 as a mask, allowing the upper surface of the epitaxial layer EL and that of a part of the channel layer CL to be exposed. Thereafter, a p type impurity is introduced by ion implantation from the thus-exposed upper surface of the epitaxial layer EL and that of a part of the channel layer CL to form a contact region CA constituted by a p$^+$ type semiconductor layer.

Figure 30:
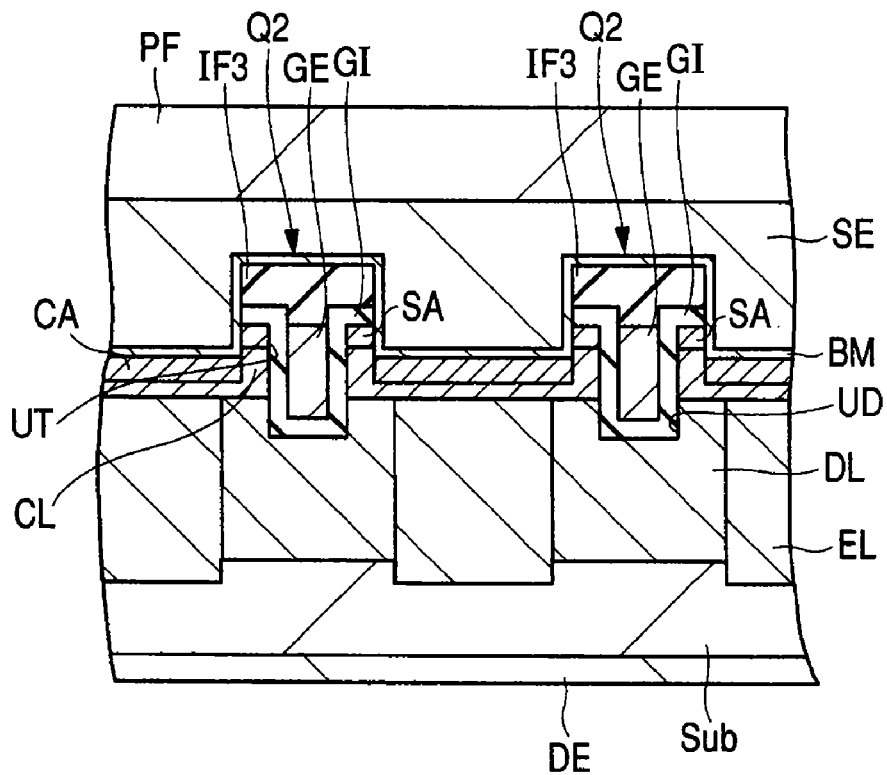
FIG. 30 is a sectional view of a principal portion in a still further step of the semiconductor device manufacturing process which follows FIG. 29.

Then, as shown in FIG. 30, barrier metal BM is formed by sputtering so as to cover the upper surface of the contact region CA and that of the insulating film IF3 and thereafter a source electrode SE constituted by an aluminum film is formed on the barrier metal BM by sputtering. Further, a protective film PF which is a polyimide film is formed by spin coating, then the back surface of the semiconductor substrate Sub is polished and thereafter a drain electrode (back electrode) DE is formed by sputtering. In this way a power transistor according to this second embodiment is completed.

Thus, the high-temperature long-time heat treatment can be reduced by using both high-energy ion implantation and RTA, whereby the channel layer CL can be formed after forming the p$^-$ type epitaxial layer EL.

The step of forming the channel layer CL is not limited to the step corresponding to FIG. 25, but for example the step corresponding to FIG. 11 will do.

(Third Embodiment)

In the manufacturing steps described above in the first embodiment in connection with FIGS. 10 and 11 a part of the epitaxial layer EL is removed by CMP or etch back until the upper surface of the insulating film IF1 becomes exposed and thereafter the insulating film IF1 is removed so that the upper surface of the epitaxial layer EL becomes higher than that of the channel layer CL. The height of the projecting upper portion of the epitaxial layer is a factor which dominates the shape of the trench UT in which the gate electrode GE is formed. In this third embodiment, therefore, a description will be given below about a technique which can adjust the height of the projecting upper portion more accurately.

Figure 31:
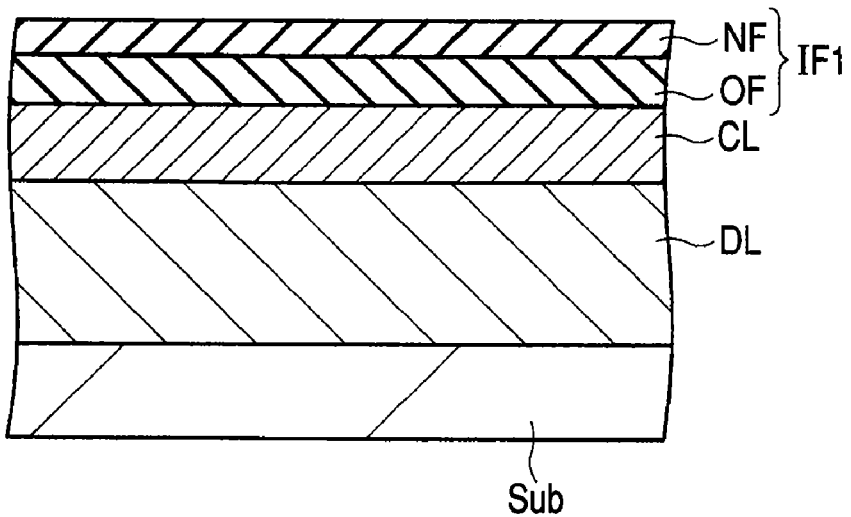
FIG. 31 is a sectional view of a principal portion in a step of a semiconductor device manufacturing process according to a third embodiment of the present invention.

With reference to FIGS. 31 to 35, the following description is now provided about a method of manufacturing a semiconductor device provided with a trench gate type power transistor using the SJ structure according to this third embodiment. A manufacturing step before the manufacturing step illustrated in FIG. 31 is the same as the manufacturing step of FIG. 5 described above in the first embodiment and therefore an explanation thereof will be omitted.

As shown in FIG. 31, a p type impurity (e.g., boron) is introduced from the upper surface side of the n⁻ type semiconductor layer SL by ion implantation to form on the drain layer DL a channel layer CL which is a p type semiconductor layer. Thereafter, an oxide film OF such as, for example, a silicon oxide film and a nitride film NF such as, for example, a silicon nitride film are formed in this order on the channel layer CL by CVD for example. The oxide film OF and the nitride film NF constitute an insulating film IF1.

Figure 32:
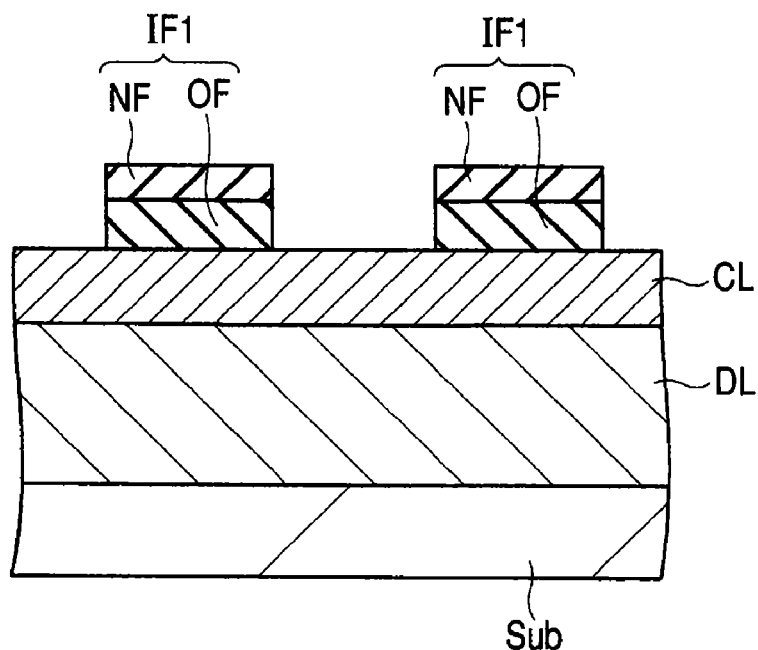
FIG. 32 is a sectional view of a principal portion in another step of the semiconductor device manufacturing process which follows FIG. 31.
Figure 33:
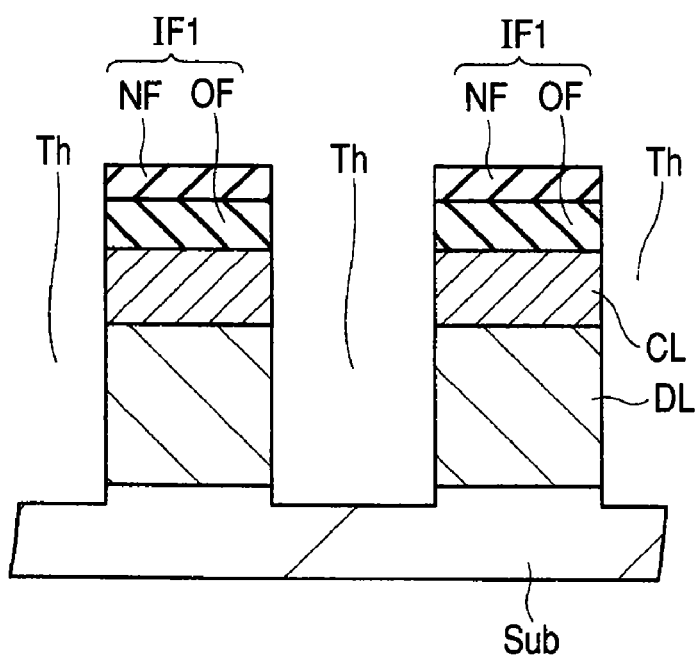
FIG. 33 is a sectional view of a principal portion in a further step of the semiconductor device manufacturing process which follows FIG. 32.

Subsequently, as shown in FIG. 32, the insulating film IF1 is subjected to patterning by photolithography and etching, then, as shown in FIG. 33, a part of the channel layer CL and that of the drain layer DL are removed using the insulating film IF as a mask to form plural trenches Th reaching the semiconductor substrate Sub.

Figure 34:
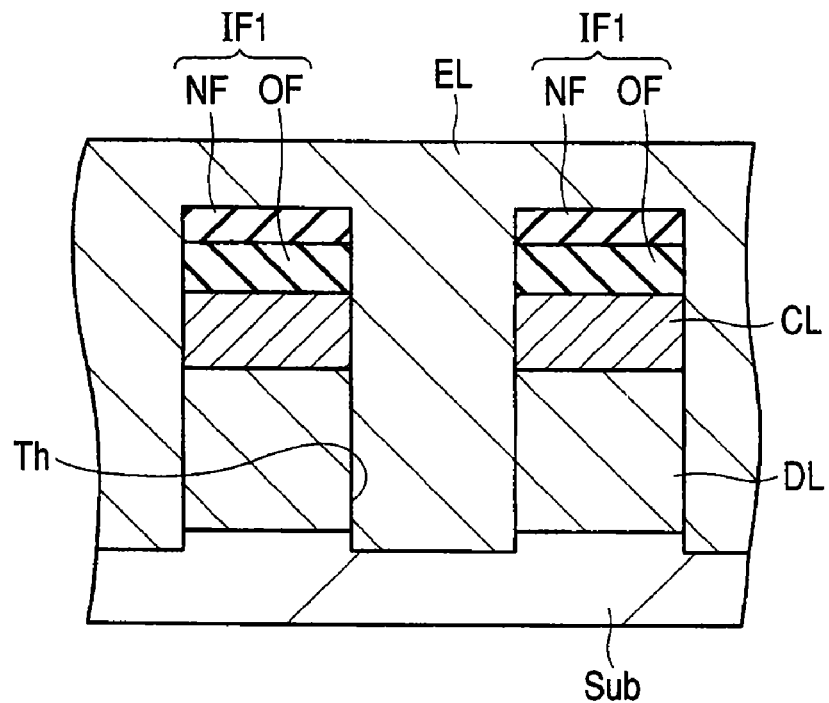
FIG. 34 is a sectional view of a principal portion in a still further step of the semiconductor device manufacturing process which follows FIG. 33.
Figure 35:
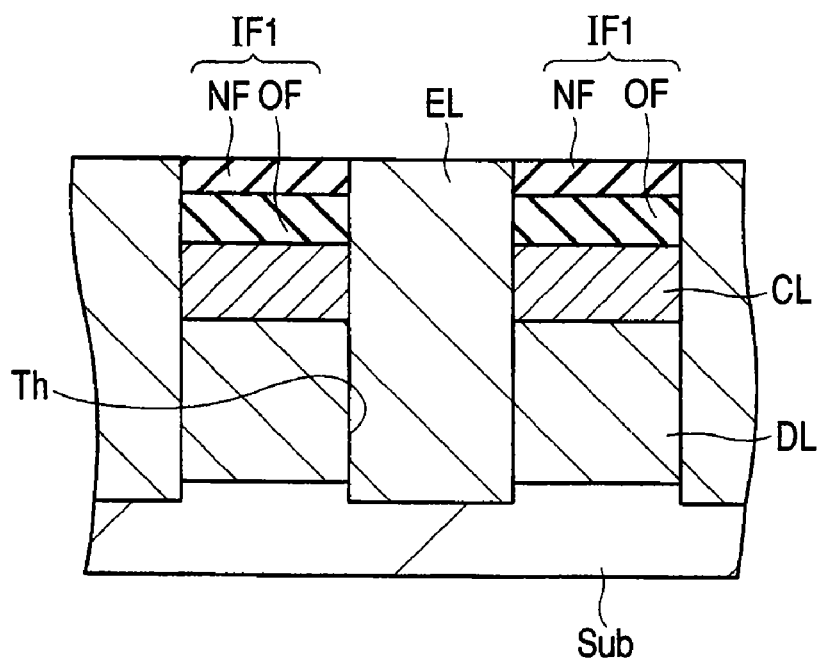
FIG. 35 is a sectional view of a principal portion in a still further step of the semiconductor device manufacturing process which follows FIG. 34.

Next, as shown in FIG. 34, by epitaxial growth using a single crystal silicon substrate, an epitaxial layer EL which is a p⁻ type semiconductor layer is formed within each trench Th and on the insulating film IF1. Then, as shown in FIG. 35, a part of the epitaxial layer EL is removed by CMP using the nitride film NF as a stopper, allowing an upper surface of the insulating film IF1 to be exposed. Thereafter, the insulating film IF1 comprising both oxide film OF and nitride film NF is removed by etching, so that the thickness thereof becomes equal to the height of the projecting upper portion of the epitaxial layer EL.

Thus, since the thickness of the insulating film IF1 can be made equal to the height of the projecting upper portion of the epitaxial layer EL by CMP using the nitride film NF as a stopper, it is possible to effect a more accurate adjustment. Consequently, the shape of a trench UT for a gate electrode GE to be formed in a later step can be made stable.

Subsequent steps are the same as in the manufacturing process described above in the first embodiment and therefore an explanation thereof will be omitted.

Although the present invention has been described above concretely by way of embodiments thereof, it goes without saying that the present invention is not limited to the above embodiments, but that various changes may be made within the scope not departing from the gist of the invention.

Although in the above embodiments the present invention is applied to power transistors of n type channel, the present invention is applicable also to power transistors of p type channel wherein the n type of constituent members is changed to p type and the p type thereof changed to n type.

The present invention is applicable widely to the semiconductor device manufacturing industry. Particularly, the present invention is effective for a semiconductor device provided with a trench gate type power transistor using the SJ structure.

What is claimed is:

1. A method of manufacturing a semiconductor device having a power MISFET, comprising steps of:
    (a) forming a first layer of a first conductivity type over a semiconductor substrate of the first conductivity type;
    (b) forming a first insulating film over the first layer;
    (c) patterning the first insulating film such that the first layer is exposed from the first insulating film;
    (d) forming a first trench in the first layer and the semiconductor substrate using the first insulating film as a mask;
    (e) filling a second layer of a second conductivity type opposite to the first conductivity type into the first trench;
    (f) removing the first insulating film, an upper surface of the second layer being higher than an upper surface of the first layer;
    (g) forming a second insulating film over the first layer and the second layer;
    (h) etching the second insulating film to form a side wall spacer over a side wall of the second layer;
    (i) forming a second trench in the first layer by using the side wall spacer as a mask;
    (j) removing the second insulating film;
    (k) forming a gate insulating film in the second trench;
    (l) forming a gate electrode over the gate insulating film such that the second trench is filled by the gate insulating film and the gate electrode;
    (m) forming a third layer of the second conductivity type in the first layer and the second layer by an ion introducing method;
    (n) forming a fourth layer of the first conductivity type in the third layer by an ion introducing method;
    (o) forming a fourth insulating film over the gate electrode;
    (p) forming a third trench in the fourth layer and the third layer using the fourth insulating film as a mask, whereby a side surface of the fourth layer is exposed; and
    (q) depositing a metal film in the third trench such that the metal film contacts the third layer and the side surface of the fourth layer.

2. A method of manufacturing a semiconductor device according to the claim 1,
    wherein, in the step (e), the second layer is formed by an epitaxial method.

3. A method of manufacturing a semiconductor device according to the claim 1,
    wherein, in the step (a), the first layer is formed by an epitaxial method.

4. A method of manufacturing a semiconductor device according to the claim 1,
    wherein the first layer is a drain region of the power MISFET,
    wherein the third layer is a channel region of the power MISFET, and
    wherein the fourth layer is a source region of the power MISFET.

5. A method of manufacturing a semiconductor device according to the claim 1,
    wherein the first conductivity type is an n-type, and
    wherein the second conductivity type is a p-type.

6. A method of manufacturing a semiconductor device according to the claim 1,
    wherein a depth of the first trench is larger than a depth of the second trench.

7. A method of manufacturing a semiconductor device according to the claim 1,
    wherein a depth of the second trench is larger than a depth of the third trench.

8. A method of manufacturing a semiconductor device according to the claim 1,
wherein a depth of the second trench is larger than a thickness of the third layer.

9. A method of manufacturing a semiconductor device according to the claim 1,
wherein a width of the fourth insulating film is larger than a width of the second trench.

10. A method of manufacturing a semiconductor device according to the claim 4,
wherein the first conductivity type is an n-type, and
wherein the second conductivity type is a p-type.

* * * * *